United States Patent
Solanki et al.

[19]

[11] Patent Number: 5,925,835
[45] Date of Patent: Jul. 20, 1999

[54] METHOD OF AND APPARATUS FOR TESTING A NOZZLE OF A PICK-AND-PLACE SYSTEM

[75] Inventors: Ranvir Singh Solanki, Cary; Kevin Kent, Woodstock, both of Ill.

[73] Assignee: Motorola, Inc., Schaumburg, Ill.

[21] Appl. No.: 08/949,259

[22] Filed: Oct. 13, 1997

[51] Int. Cl.⁶ ............................ G01N 19/00; G01L 27/00; B23P 21/00
[52] U.S. Cl. .............................. 73/865.9; 73/1.59; 29/709
[58] Field of Search .................................. 73/865.9, 1.59, 73/37, 706; 29/709

[56] References Cited

U.S. PATENT DOCUMENTS

| | | | |
|---|---|---|---|
| 4,112,736 | 9/1978 | Wheldon et al. | 73/31.04 |
| 4,458,519 | 7/1984 | Day et al. | 73/37 |
| 4,901,431 | 2/1990 | Gast | 29/709 |
| 5,381,962 | 1/1995 | Teague | 239/526 |
| 5,522,267 | 6/1996 | Lewis | 73/706 |
| 5,553,376 | 9/1996 | Solanki et al. | |

*Primary Examiner*—Hezron Williams
*Assistant Examiner*—Chad Soliz
*Attorney, Agent, or Firm*—John J. Oskorep; Richard K. Clark

[57] ABSTRACT

An apparatus (200) and method are provided for testing a nozzle of a pick-and-place system (100). The apparatus (200) includes a reservoir (206) configured to carry a fluid, a membrane (204) covering an opening of the reservoir (206), and a reservoir pressure sensor. The apparatus may further include a processor (118) coupled to the reservoir pressure sensor (208) and an output device (116) coupled to the processor (118). The nozzle (104) is positioned to contact and displace the membrane (204), thus changing the pressure of the fluid within the reservoir (206). The reservoir pressure sensor (208) senses pressure changes within the reservoir (206) and generates a signal that varies in response to the displacement of the membrane. The signal is compared to a predetermined signal to detect whether the nozzle has the proper position, the proper alignment, sufficient vacuum, and other errors affecting pick-and-place systems.

24 Claims, 3 Drawing Sheets

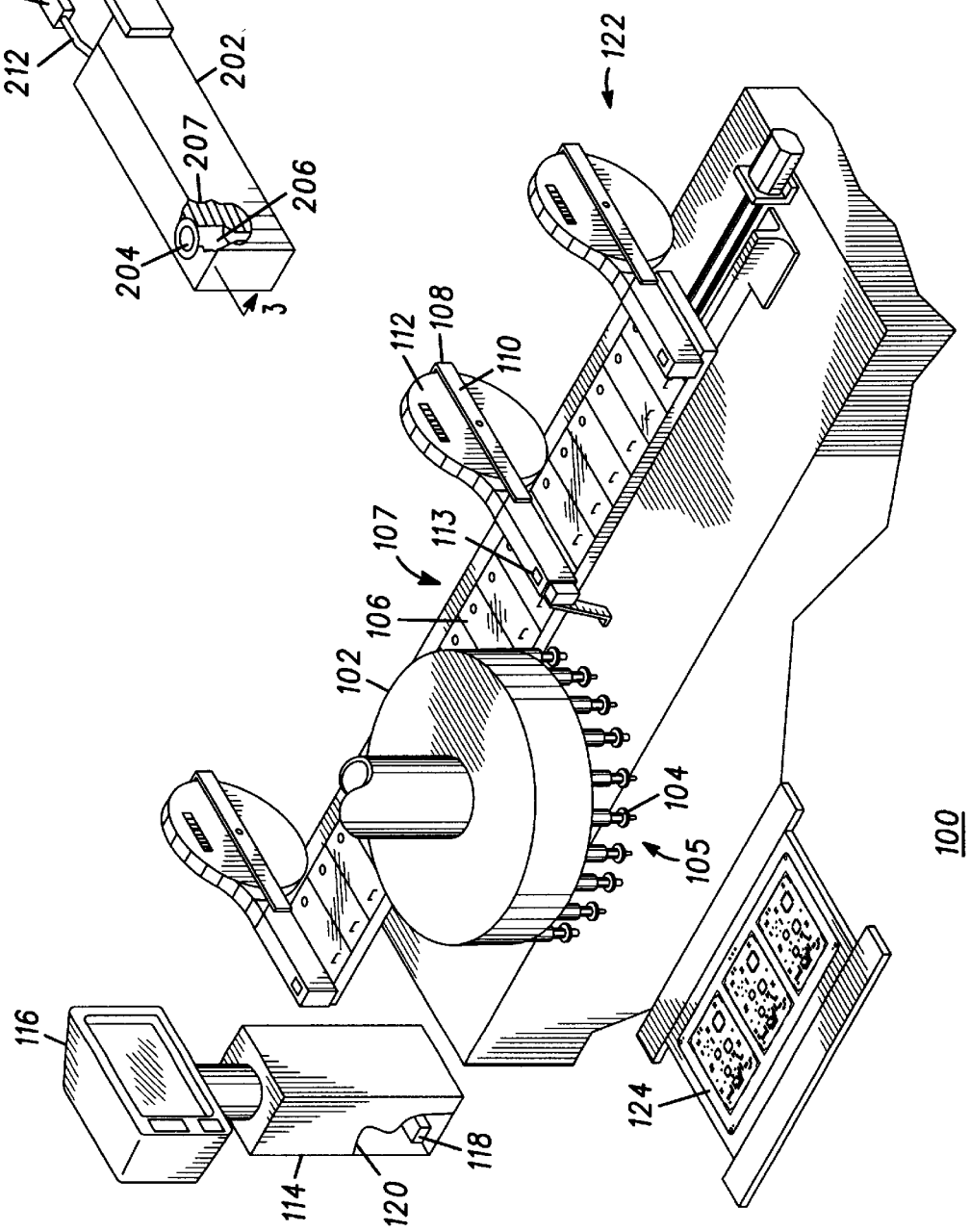

METHOD OF AND APPARATUS FOR TESTING A NOZZLE OF A PICK-AND-PLACE SYSTEM

FIELD OF THE INVENTION

The present invention relates generally to the field of pick-and-place systems.

BACKGROUND OF THE INVENTION

In the electronics industry, pick-and-place systems or assembly machines are used to populate printed circuit boards (PCBs). The pick-and-place systems include a variety of components for building a PCB. For example, a pick-and-place system typically includes a positioning device having a number of nozzles attached thereto. Using the nozzles, the positioning device selectively picks up components, held in feeders, from predetermined locations on an assembly table and places them on a substrate such as a PCB. When the PCB is completely populated, the pick-and-place system populates another PCB. These systems save a great deal of time and labor in populating PCBs.

One or more of the nozzles, however, may not be properly attached to or may be missing from the positioning device. For example, a nozzle may be off-center or positioned too high relative to a component presentation area of the pick-and-place system, or the nozzle may be bent. In addition, vacuum forces provided through the nozzles may be insufficiently low. As a result of such errors, PCBs may run through assembly without receiving important components, or with components improperly placed thereon. This results in undesirable inspection of PCBs and the pick-and-place system, which results in down-time during assembly.

Accordingly, there is a need for an apparatus for testing a nozzle of a pick-and-place system, and one especially suitable for testing a variety of characteristics of a nozzle.

BRIEF DESCRIPTION OF THE DRAWINGS

FIG. 1 is an illustration of a pick-and-place system including a positioning device and a nozzle.

FIG. 2 is an isometric view of an apparatus for testing the nozzle of the pick-and-place system of FIG. 1.

DETAILED DESCRIPTION OF THE PREFERRED EMBODIMENTS

Figure 3:
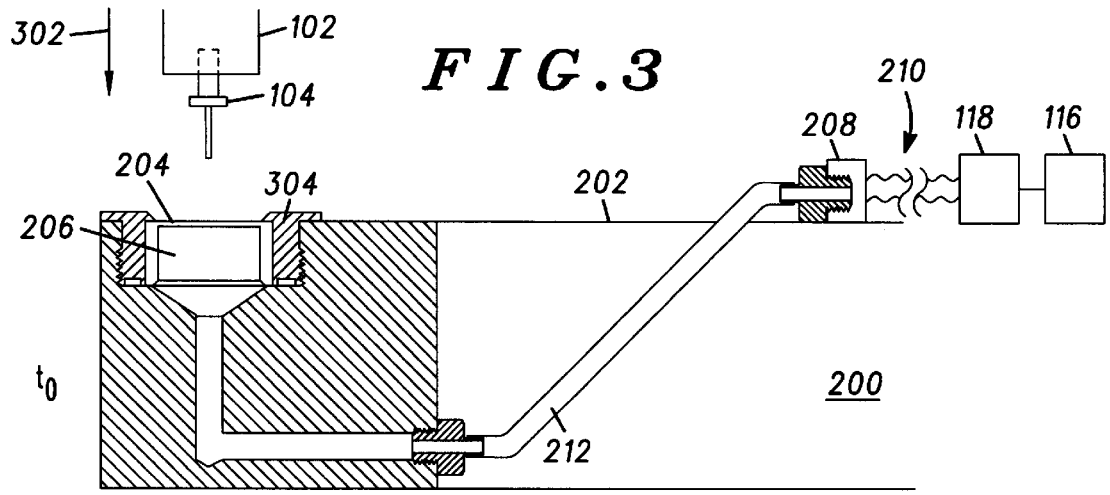
FIG. 3 is a cross section view of the apparatus taken along a line 3—3' of FIG. 2, showing a reservoir, a membrane, and a reservoir pressure sensor of the apparatus.

A method of and apparatus for testing a nozzle of a pick-and-place system is disclosed. The apparatus includes a reservoir, a membrane covering an opening of the reservoir and sized to receive contact from the nozzle, and a reservoir pressure sensor. The apparatus may further include a processor coupled to the reservoir pressure sensor and an output device coupled to the processor. The method includes positioning the nozzle for contact with the membrane, generating a signal that varies in response to displacement of the membrane, comparing the signal to a predetermined signal, and performing an error function in response to comparing.

FIG. 1 is an illustration of an assembly machine or a pick-and-place system 100. Pick-and-place system 100 includes a positioning device 102 having a plurality of nozzles 105, such as a nozzle 104, detachably mounted thereon. Many of the plurality of nozzles 105 have different sizes and/or shapes to pickup electronic components varying in size and weight. Pick-and-place system 100 also includes an assembly table 106 having a plurality of slots 107 defined thereon, a plurality of feeders 122 detachably mounted in the plurality of slots 107, a vacuum system (not shown) for selectively providing a low pressure vacuum force through the plurality of nozzles 105, a control unit 114, and an output device 116.

Control unit 114 contains electronic circuitry and components, including a processor 118 shown through a cutaway 120, for controlling most aspects related to pick-and-place system 100. With processor 118, control unit 114 controls the vacuum force of the vacuum system and the movement of positioning device 102, which is rotatable and movable in the x-, y-, and z- directions. Processor 118 preferably includes a memory and an analog-to-digital (A/D) converter (not shown), and a software program stored in the memory for such control. Output device 116 is coupled to processor 118, and is typically used to provide instructions and information to an operator of pick-and-place system 100. Preferably, output device 116 includes a visual display.

Each of the plurality of feeders 122, such as a feeder 108, includes a frame 110, a component reel 112 rotatably mounted thereon, and a component presentation area 113. Using the plurality of nozzles 105 and the vacuum system, positioning device 102 typically operates in a conventional manner to pick up electronic components from the plurality of feeders 122 and populate a substrate such as a printed circuit board (PCB) 124. For each of the plurality of nozzles 105, a spring (not visible) is provided to compensate for the downwards acting force on an electronic component. The location of the electronic components is important, since pick-and-place system 100 populates PCB 124 based on each component being located at a component presentation area.

Nozzle 104, however, may not be properly attached to or may be missing from positioning device 102. There may be an error in location, height, center position, etc., of nozzle 104. Also, the vacuum force provided through nozzle 104 may be insufficient or non-existent for pickup or for high-speed positioning. These problems typically result in mispicked electronic components, which results in electronic components being misplaced or missing from PCB 124.

FIG. 2 shows an apparatus 200 for testing the plurality of nozzles 105 of pick-and-place system 100, shown enlarged relative to FIG. 1 for viewing purposes only. Apparatus 200 is constructed from and within a frame 202 that is similar to frame 110 of feeder 108, and is thus configured to detachably mount in one of the plurality of slots 107. Apparatus 200 includes a membrane 204, a reservoir 206 (partially visible through a cutaway 207) having an opening covered by and sealed with membrane 204, and a reservoir pressure sensor 208.

In this embodiment, membrane 204 is made from a flexible material, preferably rubber. Membrane 204 is sized and provided to receive contact from nozzle 104, and preferably sized and provided to receive contact from each of the plurality of nozzles 105 used for assembling PCB 124. In this embodiment, the components to be picked and placed on PCB 124 are very small. Accordingly, membrane 204 is circular in shape and has a diameter of about 0.6 cm, where the plurality of nozzles 105 have an average length of about 2.0 cm and an average tip diameter of about 1.0 mm. Apparatus 200 is appropriately positioned within pick-and-place system 100, and thus membrane 204 is provided in a component presentation area of pick-and-place system 100.

Reservoir 206 is formed within a durable body, and may include a tubing 212. Reservoir 206 is configured to carry a fluid, which may be a liquid or a gas. In the embodiment described, reservoir 206 is sized to approximately hold about 0.085 cm$^3$ of the fluid. Preferably, the fluid in reservoir 206 is a gas providing sufficient resistance to quickly dampen movement of membrane 204.

Reservoir pressure sensor 208 is configured and positioned to sense a fluid pressure in reservoir 206, and to generate a signal corresponding to such pressure. Since the fluid pressure changes upon displacement of membrane 204, reservoir pressure sensor 208 assists in generating signals that vary in response to displacement of membrane 204. Such displacement occurs when membrane 204 receives contact from a nozzle, such as nozzle 104. Reservoir pressure sensor 208 may be a pressure transducer. Preferably, the signals from reservoir pressure sensor 208 convey information sufficient to distinguish between small variations of pressure in reservoir 206 while covering a full pressure range therein (e.g., the range defined by a maximum and minimum pressure in reservoir 206).

For example, when membrane 204 is not flexed, the fluid pressure in reservoir 206 is stable and reservoir pressure sensor 208 may have an output of zero volts. When membrane 204 is displaced in a downward flexed position, the fluid pressure increases and the output of reservoir pressure sensor 208 may correspondingly increase to five volts. When membrane 204 is displaced in an upward flexed position, the fluid pressure decreases and the output of reservoir pressure sensor 208 may correspondingly decrease to negative five volts.

Although apparatus 200 may operate with an independent processor and output device, apparatus 200 preferably operates with and includes processor 118 and output device 116 of pick-and-place system 100. Here, reservoir pressure sensor 208 is coupled to processor 118 via lines 210. Thus, in the preferred embodiment, the software program of processor 118 is modified to accommodate the operation of apparatus 200.

Figure 4:
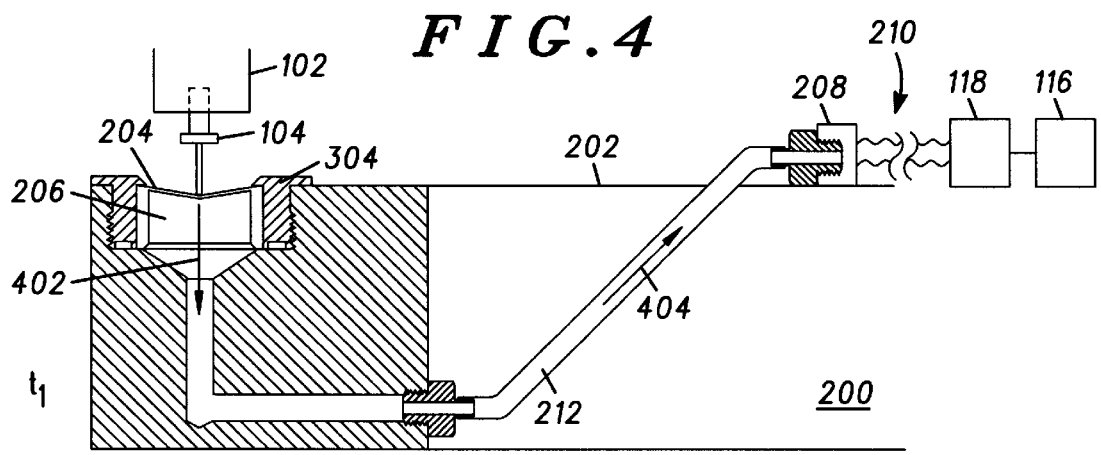
FIG. 4 is the cross section view of FIG. 3, where the nozzle is positioned such that the membrane is flexed in a downward flexed position.
Figure 5:
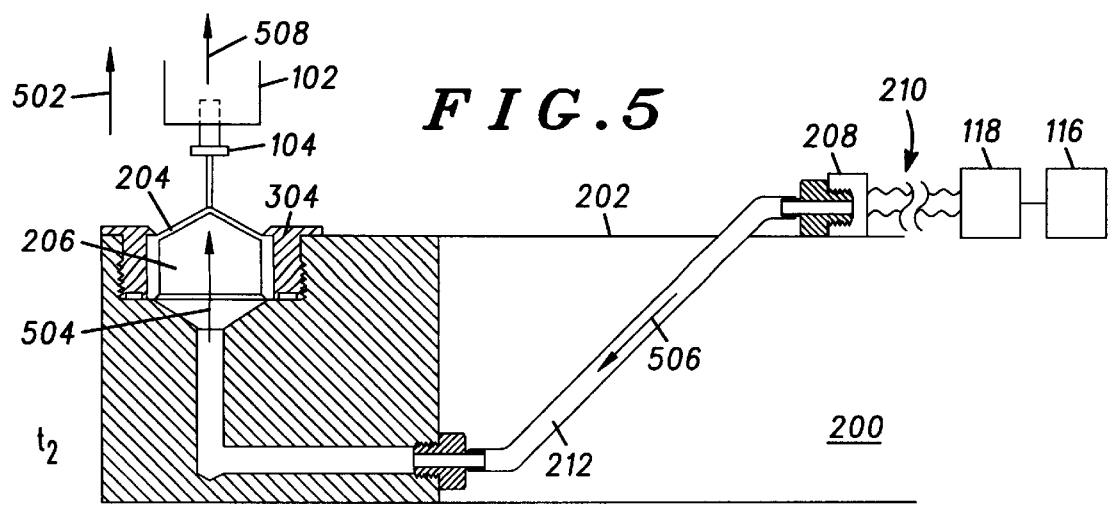
FIG. 5 is the cross section view of FIG. 3, where the nozzle is positioned such that the membrane is flexed in an upward flexed position.
Figure 6:
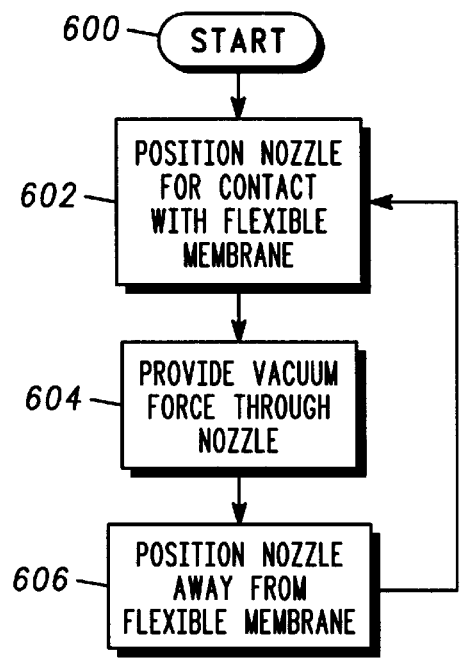
FIG. 6 is a flowchart describing a method of testing the nozzle, from an operational standpoint of the pick-and-place system.
Figure 7:
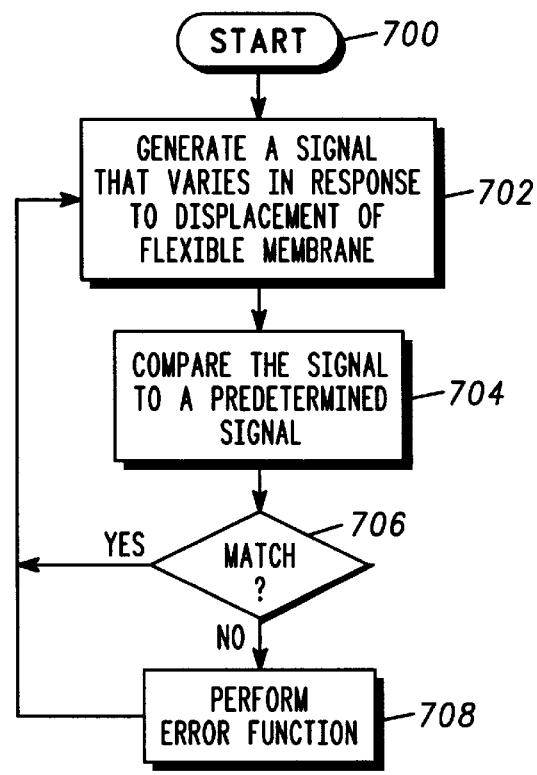
FIG. 7 is a flowchart describing a method of testing the nozzle, from an operational standpoint of the apparatus.

FIGS. 6 and 7 are flowcharts describing a method of testing nozzle 104 of pick-and-place system 100. More specifically, FIG. 6 is a flowchart describing the method from an operational standpoint of pick-and-place system 100, and FIG. 7 is a flowchart describing the method from an operational standpoint of apparatus 200. FIGS. 3–5, which illustrate particular positions of nozzle 104 described in relation to FIGS. 6 and 7, illustrate cross section views of apparatus 200 and side views of positioning device 102 having nozzle 104 attached thereto. As shown in FIGS. 3–5, membrane 204 is preferably sealed to and covering the opening of reservoir 206 with a stainless steel threaded collar 304, which at least partially forms reservoir 206.

The method will be described referring to the flowcharts of FIGS. 6 and 7, and the views of FIGS. 3–5, in combination. Starting at a block 600 of FIG. 6, the software program in processor 118 instructs positioning device 102 to position nozzle 104, at appropriate coordinates, for making contact with membrane 204 (step 602). Such positioning is illustrated by an arrow 302 of FIG. 3. If nozzle 104 is properly attached, such positioning results in nozzle 104 making contact with and displacing, in a downward direction, membrane 204 to a downward flexed position as shown in FIG. 4. The fluid pressure in reservoir 206 increases as indicated by arrows 402 and 404. Here, since membrane 204 is flexible, compression of the spring associated with nozzle 104 is much smaller than when nozzle 104 makes contact with a component. If nozzle 104 is improperly attached, contact may be made where displacement is measurably different from the displacement shown in FIG. 4. Of course, if nozzle 104 is attached very poorly or not attached at all, little or no displacement is made in the downward direction.

Referring back to FIG. 6, processor 118 enables the vacuum system for providing a vacuum force through nozzle 104 (step 604). Such vacuum force is indicated by an arrow 508 of FIG. 5. Next, the software program in processor 118 instructs positioning device 102 to position nozzle 104 away from membrane 204 (step 606). Such positioning is indicated by an arrow 502 of FIG. 5. If nozzle 104 is properly attached and the vacuum force is appropriately provided, such positioning and force results in nozzle 104 pulling and displacing, in an upward direction, membrane 204 to an upward flexed position as shown in FIG. 5. Here, the fluid pressure in reservoir 206 decreases as indicated by arrows 504 and 506. If nozzle 104 is improperly attached or the vacuum force is improperly provided, however, such displacement is measurably different from the displacement shown. Of course, if nozzle 104 is attached very poorly or not attached, or if the vacuum force is not provided, little or no displacement is made in the upward direction.

Sometime during step 606, when an elasticity force of membrane 204 exceeds the vacuum and positional force of nozzle 104, membrane 204 is detached from nozzle 104 and resonates. The resonation of membrane 204 is quickly dampened by the fluid in reservoir 206. The method may continue back at step 602 of FIG. 6, where another nozzle of the plurality of nozzles 105 is positioned for contact with membrane 204.

Apparatus 200 operates as described in relation to the flowchart of FIG. 7. During steps 602–606 of FIG. 6, and starting at a block 700 of FIG. 7, reservoir pressure sensor 208 is enabled to generate a signal that varies in response to the fluid pressure in reservoir 206, and thus generates a signal that varies in response to displacement of membrane 204 (step 702). Processor 118 is enabled to read such signal. The A/D converter of processor 118 converts the signal to digital form, and stores digital voltage values in the memory.

Next, preferably following steps 602–606 of FIG. 6, processor 118 compares at least a portion of the signal and at least a portion of a predetermined signal stored in its memory (step 704). Preferably, the signal from reservoir pressure sensor 208 includes a voltage, and step 704 includes comparing the voltage to a predetermined voltage stored in the memory. Also preferably, the predetermined signal includes a plurality of digital voltage values of a predetermined signal as described later in relation to FIG. 8.

If the signal and the predetermined signal sufficiently match (step 706), then no error is detected and the method continues back at step 702 for testing another nozzle. If the signal and the predetermined signal do not match in some respect, then an error condition is detected and processor 118 performs an error function (step 708). After the error function is performed, the method may continue back at step 702 for testing another nozzle. Preferably, in step 706, processor 118 uses a predetermined acceptable range of values for making such decision.

The error function may include, for example, toggling a voltage at an output of processor 118, retrieving stored error information from the memory, or generating an error signal at an audible frequency. The error function may result in, for example, generating an error response at output de vice 116, halting operation of pick-and-place system 100, and/or providing feedback corresponding to the nature or degree of error correction required.

Preferably, output device 116 displays visual information and/or sounds audible information that is indicative of the error response. For example, if nozzle 104 is improperly mounted or not attached to positioning device 102, processor 118 may send signals to output device 116 for visually displaying the words "CHECK NOZZLE ATTACHMENT" and indicating which nozzle is in error. If the vacuum force in nozzle 104 is set too high or too low, processor 118 may send signals to output device 116 for visually displaying the words "CHECK VACUUM PRESSURE" and indicating which nozzle has the error. Thus, output device 116 outputs the error responses generated by processor 118. Depending on the desired design and complexity, the error responses may be indicative of one of several other possible errors, including an error in a height or a center position of nozzle 104.

Figure 8:
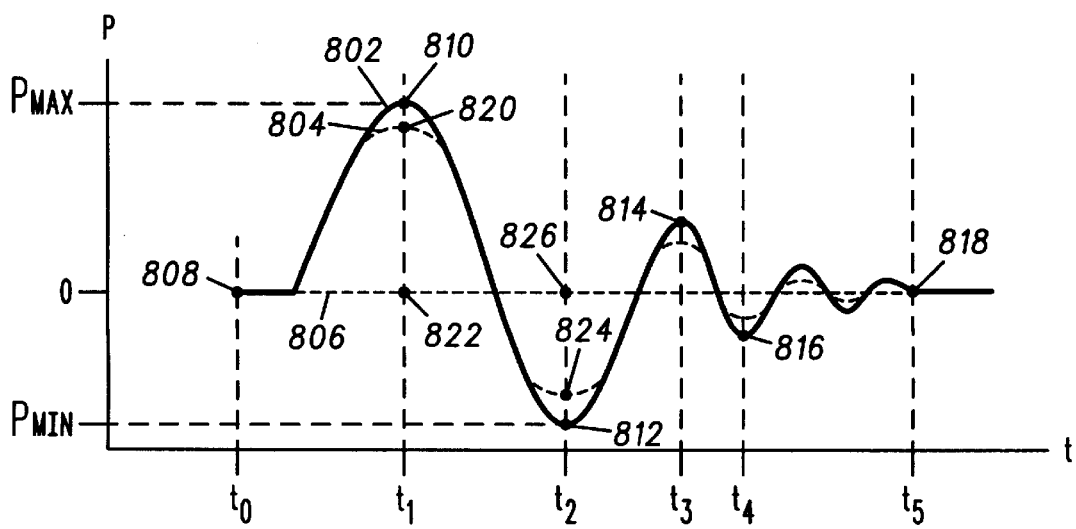
FIG. 8 is a graph showing signals corresponding to variations of fluid pressure in the reservoir.

FIG. 8 is a graph showing signals corresponding to the fluid pressure in reservoir 206 generated in relation to the above-described method. The graph of FIG. 8 shows a predetermined signal 802, a first test signal 804 (in dashed lines), and a second test signal 806 (also in dashed lines). Voltage signals measured at processor 118 are preferably directly proportional to such pressure signals.

Predetermined signal 802 is a signal obtained by employing the above method, where nozzle 104 is properly mounted on positioning device 102 and a proper vacuum force is applied through nozzle 104. Preferably, predetermined signal 802 is stored in the memory of processor 118 as a series of digital voltage values. Predetermined signal 802 may be obtained through an appropriately conducted calibration procedure with pick-and-place system 100 and apparatus 200, where several predetermined signals (corresponding to and obtained from the use of different nozzles having different characteristics) are stored in the memory.

In FIG. 8, predetermined signal 802 generally has the shape of an exponentially decreasing sinusoid, and shows points of fluid pressure in reservoir 206 including points 808, 810, 812, 814, 816, and 818. At time to the fluid pressure at point 808 is generally stable, where membrane 204 is not flexed or displaced (as in FIG. 3). At time t1, the fluid pressure at point 810 is at an expected maximum ($P_{max}$), where membrane 204 is flexed to a downward flexed position (as in FIG. 4). At a time $t_2$, the fluid pressure at point 812 is at an expected minimum ($P_{min}$), where membrane 204 is flexed to an upward flexed position (as in FIG. 5). At times $t_3$ and $t_4$, the fluid pressure is at a second maximum and minimum at points 814 and 816, respectively, where membrane 204 resonates after being released from nozzle 104 (occurring after that shown in FIG. 5). As shown in FIG. 8, subsequent resonation may occur until membrane 204 is fully dampened and the fluid pressure is stable at point 818.

During the operation of pick-and-place system 100, if nozzle 104 is not positioned properly on positioning device 102, or if the vacuum pressure provided therethrough is insufficient, any signals generated from reservoir pressure sensor 208 during such method will deviate from predetermined signal 802. First test signal 804 and second test signal 806 of FIG. 8 are examples of such signals.

First test signal 804 represents a signal generated when nozzle 104 is attached improperly. For example, nozzle 104 may be attached on positioning device 102 such that it is off-center relative to a center of membrane 204. Like predetermined signal 802, first test signal 804 generally has the shape of an exponentially decreasing sinusoid, but has smaller maximum and minimum peaks. At time $t_1$, since nozzle 104 is not centered, it does not displace membrane 204 as far downward as it would normally (as in FIG. 4). Thus, the fluid pressure at a point 820 of first test signal 804 is slightly lower than that at point 810 of predetermined signal 802. At time $t_2$, nozzle 104 does not pull membrane 204 as far upward as it would normally (as in FIG. 5) for the same reason. Thus, the fluid pressure at a point 824 of first test signal 804 is slightly greater than that at point 812 of predetermined signal 802. Here, processor 118 compares points 810 and 812 with points 820 and 824, respectively, detects an intolerable difference therebetween based on a predetermined acceptable range, and performs an appropriate error function.

As another example, the vacuum pressure through nozzle 104 may be too low. Here, assuming that nozzle 104 is otherwise attached properly, at time $t_1$, nozzle 104 does displace membrane 204 as far downward as it should (as in FIG. 4). Thus, the fluid pressure at point 820 may in fact match that at point 810 of predetermined signal 802 (not as shown in FIG. 8). At time $t_2$, however, nozzle 104 does not pull membrane 204 as far upward as it would normally (as in FIG. 5), and the fluid pressure at point 824 may be slightly greater than that at point 812 (as shown in FIG. 8). Thus, an error in the vacuum pressure may be distinguishable from an error in attachment of nozzle 104. It is understood that other distinguishing factors for error determination are possible.

Second test signal 806 represents a signal generated when nozzle 104 is attached very poorly to or is missing from positioning device 102. Unlike predetermined signal 802, second test signal 806 generally has the shape of a horizontal straight line. At time $t_1$, nozzle 104 makes no contact with membrane 204 as it would normally (as in FIG. 4), and the fluid pressure at a point 822 of second test signal 806 is considerably less than that at point 810 of predetermined signal 802, and is likely to be equivalent to that at point 808. At time $t_2$, nozzle 104 does not at all pull membrane 204 as it would normally (as in FIG. 5), and the fluid pressure at a point 826 of second test signal 806 is considerably greater than that at point 812 of predetermined signal 802, and is likely to be equivalent to that at points 808 and 822. Processor 118 compares points 810 and 812 with points 822 and 826, respectively, detects an intolerable difference therebetween based on a predetermined acceptable range, and performs an appropriate error function.

Thus, apparatus 200 is capable of testing a "goodness" of each of the plurality of nozzles 105 and is especially suitable for testing a variety of characteristics thereof. Detailed inspection of such characteristics is computer-controlled and automated, thereby eliminating or reducing time-consuming human inspection of each of the plurality of nozzles 105 and PCBs. Assembly down-time is desirably reduced. Apparatus 200 is situated in pick-and-place system 100 and nozzle 104 is positioned as if a component in a component presentation area required pickup at membrane 204. Thus, in many ways, the use of apparatus 200 is transparent to the normal operation of pick-and-place system 100. Such testing may be provided, for example, at appropriate time periods as requested by an operator of such system, or at predetermined time periods during conventional operation.

While particular embodiments of the present invention have been shown and described, modifications may be made. For example, although apparatus 200 is embodied in frame 202 of a component feeder, other suitable structures may be used, such as a component matrix tray or a component tube. Apparatus 200 may be permanently fixed and positioned within pick-and-place system 100, and/or may be positioned outside of the component presentation area . Apparatus 200 may be configured for use in any type of pick-and-place system, which may include any type of nozzle head such as a single nozzle head, a rotating-type head, a turret-type head, or a gang-place-type head. Although, the use of processor 118 and the software program is preferred, one or more functions of processor 118 may be implemented using other suitable hardware configurations. Instead of membrane 204 being a flexible membrane, it is understood that a rigid body may be used with springs or other suitable mechanisms. It is therefore intended in the appended claims to cover all such changes and modifications which fall within the true spirit and scope of the invention.

What is claimed is:

1. An apparatus for testing a nozzle of a pick-and-place system, said apparatus comprising:
   a durable body forming a reservoir with an opening, said reservoir configured to carry a fluid;
   a membrane covering the opening of said reservoir and sized to receive contact from the nozzle, wherein the membrane is positioned for contact with a nozzle of the pick-and-place system; and
   a reservoir pressure sensor positioned to sense a pressure of the fluid within the reservoir.

2. The apparatus according to claim 1, wherein said reservoir pressure sensor is configured to generate at least one signal that varies in response to displacement of said membrane.

3. The apparatus according to claim 2, wherein the at least one signal is responsive to non-displacement of said membrane.

4. The apparatus according to claim 2, further comprising:
   a processor coupled to receive the at least one signal from said reservoir pressure sensor.

5. The apparatus according to claim 4, wherein said processor compares the at least one signal to at least one predetermined signal to perform at least one error function, said apparatus further comprising:
   an output device coupled to said processor, said output device to output at least one error response based on the at least one error function.

6. The apparatus according to claim 1, wherein said membrane is provided in a component presentation area of the pick-and-place system.

7. A pick-and-place system capable of testing a nozzle, comprising:
   a positioning device;
   at least one nozzle mounted to said positioning device;
   a durable body forming a reservoir with an opening, said reservoir configured to carry a fluid;
   a membrane covering the opening of said reservoir, said membrane positioned at or near a component presentation area of the pick-and-place system;
   a reservoir pressure sensor positioned to sense a pressure of the fluid within the reservoir; and
   a processor coupled to said reservoir pressure sensor.

8. The pick-and-place system according to claim 7, wherein said reservoir pressure sensor generates at least one signal responsive to displacement of said membrane, wherein said processor receives the at least one signal from said reservoir pressure sensor, the processor comparing the at least one signal with at least one predetermined signal to perform at least one error function.

9. The apparatus according to claim 8, wherein the at least one signal is responsive to non-displacement of said membrane.

10. The pick-and-place system according to claim 7, further comprising an output device coupled to said processor.

11. A method of testing a nozzle of a pick-and-place system, the method comprising the steps of:
    positioning the nozzle for contact with a membrane;
    attempting to displace the membrane using the nozzle; and
    generating at least one signal that varies in response to displacement of the membrane.

12. The method according to claim 11, wherein the step of generating at least one signal includes the substep of generating at least one signal responsive to non-displacement of said membrane.

13. The method according to claim 11, further comprising the steps of:
    comparing the at least one signal with at least one predetermined signal; and
    performing at least one error function in response to the step of comparing.

14. The method according to claim 13, wherein the step of performing at least one error function includes the step of generating an error response indicative of an error in a height of the nozzle.

15. The method according to claim 13, wherein the step of performing at least one error function includes the step of generating an error response indicative of an error in a center position of the nozzle.

16. The method according to claim 13, wherein the step of performing at least one error function includes the step of generating an error response indicative of an error in a vacuum force of the nozzle.

17. The method according to claim 11, wherein the step of attempting to displace the membrane results in displacing at least a portion of the membrane to a flexed position.

18. The method according to claim 17, wherein the step of generating at least one signal includes the step of generating at least one signal having a voltage corresponding to the flexed position, the method further comprising the steps of:
    comparing the voltage and a predetermined voltage; and
    performing at least one error function in response to the step of comparing.

19. A method of testing a nozzle of a pick-and-place system, the method comprising the steps of:
    positioning the nozzle for contact with a membrane;
    providing a vacuum force in the nozzle;
    moving the nozzle to displace the membrane; and
    generating at least one signal that varies in response to displacement of the membrane.

20. The method according to claim 19, wherein the step generating at least one signal includes the substep of generating at least one signal responsive to non-displacement of said membrane.

21. The method according to claim 19, further comprising the steps of:

comparing the at least one signal and at least one predetermined signal; and performing at least one error function in response to the step of comparing.

22. The method according to claim 21, wherein the step of performing at least one error function includes the step of generating an error response indicative of an error in the vacuum force.

23. The method according to claim 19, wherein the step of moving the nozzle results in displacing at least a portion of the membrane to a flexed position.

24. The method according to claim 23, wherein the step of generating at least one signal includes the step of generating at least one signal having a voltage corresponding to the flexed position, the method further comprising the steps of:

comparing the voltage and a predetermined voltage; and performing at least one error function in response to the step of comparing.

* * * * *